United States Patent
Hao et al.

(10) Patent No.: US 6,760,873 B1
(45) Date of Patent: Jul. 6, 2004

(54) BUILT-IN SELF TEST FOR SPEED AND TIMING MARGIN FOR A SOURCE SYNCHRONOUS IO INTERFACE

(75) Inventors: Hong Hao, Saratoga, CA (US); Keven B Hui, Union City, CA (US); Qingwen Deng, Sunnyvale, CA (US); Chung-Jen Yui, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 496 days.

(21) Appl. No.: 09/815,519

(22) Filed: Mar. 23, 2001

Related U.S. Application Data (60) Provisional application No. 60/236,896, filed on Sep. 28, 2000.

(51) Int. Cl.[7] .............................................. G01R 31/28
(52) U.S. Cl. ........................ 714/724; 324/73.1; 326/16
(58) Field of Search ................................ 714/724, 721, 714/732, 728, 726; 375/221; 711/167; 327/552; 332/109; 398/154; 324/73.1, 751; 235/462.07; 713/200; 326/16

(56) References Cited

U.S. PATENT DOCUMENTS

| | | | | |
|---|---|---|---|---|
| 4,503,537 A | * | 3/1985 | McAnney ................... 714/728 |
| 4,833,397 A | * | 5/1989 | McMurray, Jr. ............. 324/73.1 |
| 5,289,060 A | * | 2/1994 | Elnashar et al. ............ 327/552 |
| 5,422,891 A | * | 6/1995 | Bushnell et al. ............ 714/732 |
| 5,428,321 A | * | 6/1995 | Yoshida et al. ............. 332/109 |
| 5,468,946 A | * | 11/1995 | Oliver .................... 235/462.07 |
| 5,528,156 A | * | 6/1996 | Ueda et al. ................. 324/751 |
| 5,787,114 A | * | 7/1998 | Ramamurthy et al. ...... 375/221 |
| 5,953,502 A | * | 9/1999 | Helbig, Sr. ................. 713/200 |
| 5,956,370 A | * | 9/1999 | Ducaroir et al. ............ 375/221 |
| 6,148,425 A | * | 11/2000 | Bhawmik et al. ........... 714/726 |
| 6,167,495 A | * | 12/2000 | Keeth et al. ................. 711/167 |
| 6,239,892 B1 | * | 5/2001 | Davidson .................... 398/154 |
| 6,629,274 B1 | * | 9/2003 | Tripp et al. ................. 714/721 |

* cited by examiner

*Primary Examiner*—Albert Decady
*Assistant Examiner*—Dipakkumar Gandhi
(74) *Attorney, Agent, or Firm*—Trexler, Bushnell, Giangiorgi & Blackstone, Ltd.

(57) ABSTRACT

A built-in self test implementation for testing the speed and timing margins of the IO pins of a source synchronous IO interface (SSIO). The implementation preferably includes built-in self test logic including a pseudo-random pattern generator which is configured to generate input sequences. Buffers are connected to the IO pins, and the buffers are configured to receive the input sequences. The buffers are connected to multiple input signature registers, and the multiple input signature registers are configured to receive the input sequences from the pseudo-random pattern generator and generate signatures. Comparators are provided to compare the signatures to expected vector values and generate a pass/fail output signal. Preferably, at least one programmable delay cell is disposed between each buffer and the multiple input signature registers. The programmable delay cells provide that propagation delays can be set to perform timing margin tests.

56 Claims, 10 Drawing Sheets

BUILT-IN SELF TEST FOR SPEED AND TIMING MARGIN FOR A SOURCE SYNCHRONOUS IO INTERFACE

RELATED APPLICATION

This application claims the benefit of U.S. Provisional Application Serial No. 60/236,896, filed on Sep. 28, 2000.

BACKGROUND

This invention generally relates to devices and methods for testing a source synchronous IO interface, and more specifically relates to a built-in self test implementation for testing a source synchronous IO interface.

The timing requirements for high speed source synchronous IO (SSIO) interfaces are highly demanding for existing and even future automatic test equipment (ATE). The challenges are driven in several directions. The most challenging is the accuracy requirement. Traditionally, IO pins are individually specified, characterized, and tested for setup and hold times for input pins and pin-to-pin delay for output pins. For SSIO interfaces, timing is specified for a group of pins including data and clock pins. For a receiver (RX port), the setup and hold times are with respect to the clocks that are part of the port. The clocks themselves do not have fixed timing, which makes measuring the data pins against a fixed reference harder. Secondly and more importantly, the aggregate setup and hold times are already in the range of less than 150 ps. Today's high accuracy ATE can achieve edge placement accuracy of +/−100 ps. So to accommodate the ATE pin timing inaccuracy such that there is no unnecessary yield loss due to ATE inaccuracy, the setup and hold times can only be tested at close to twice the required values. A third consideration is that since there can be a large number of instantiations of SSIO interfaces in VLSI chips, the ATE would have to support not only high accuracy, but also a large number of high accuracy pins. Consequently, the ATE required for testing such chips could be quite costly.

SSIO interfaces have been used in high performance VLSI chips. The known techniques in use in the industry to test SSIO interfaces fall into several categories. The most widely used is probably functional tests. Functional tests rely on the ATE to provide stimulus to a device under test (DUT), and to sample output values from the DUT. This technique can be used to test the full functional specification of the SSIO interface. However, as mentioned above, this technique can no longer meet the increasingly high speed and accuracy requirements of today's SSIO interfaces.

Another technique in use is a system test approach. This technique relies on previously characterized, or so called "golden", devices and board to provide stimulus to and sample outputs from the DUT. This technique provides that speed can be measured effectively in a realistic system environment. However, it is not easy to perform accurate DC tests as well as AC timing margin tests. The accuracy can also be affected by how stable the "golden" devices are in a production environment and throughout production cycles. Additionally, this technique usually requires more than one production test pass.

Figure 1:
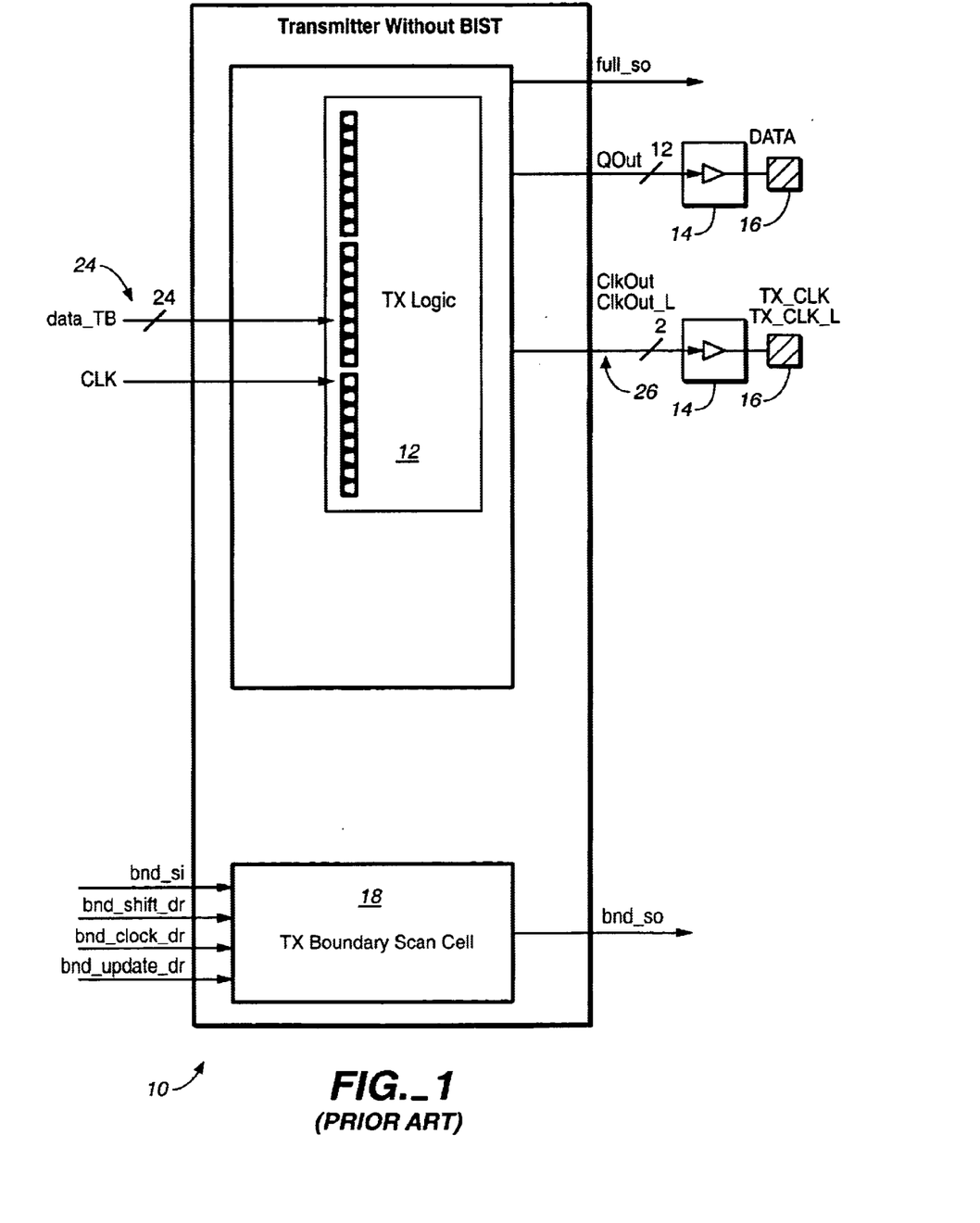
FIG. 1 is a schematic diagram of a prior art transmitter.
Figure 2:
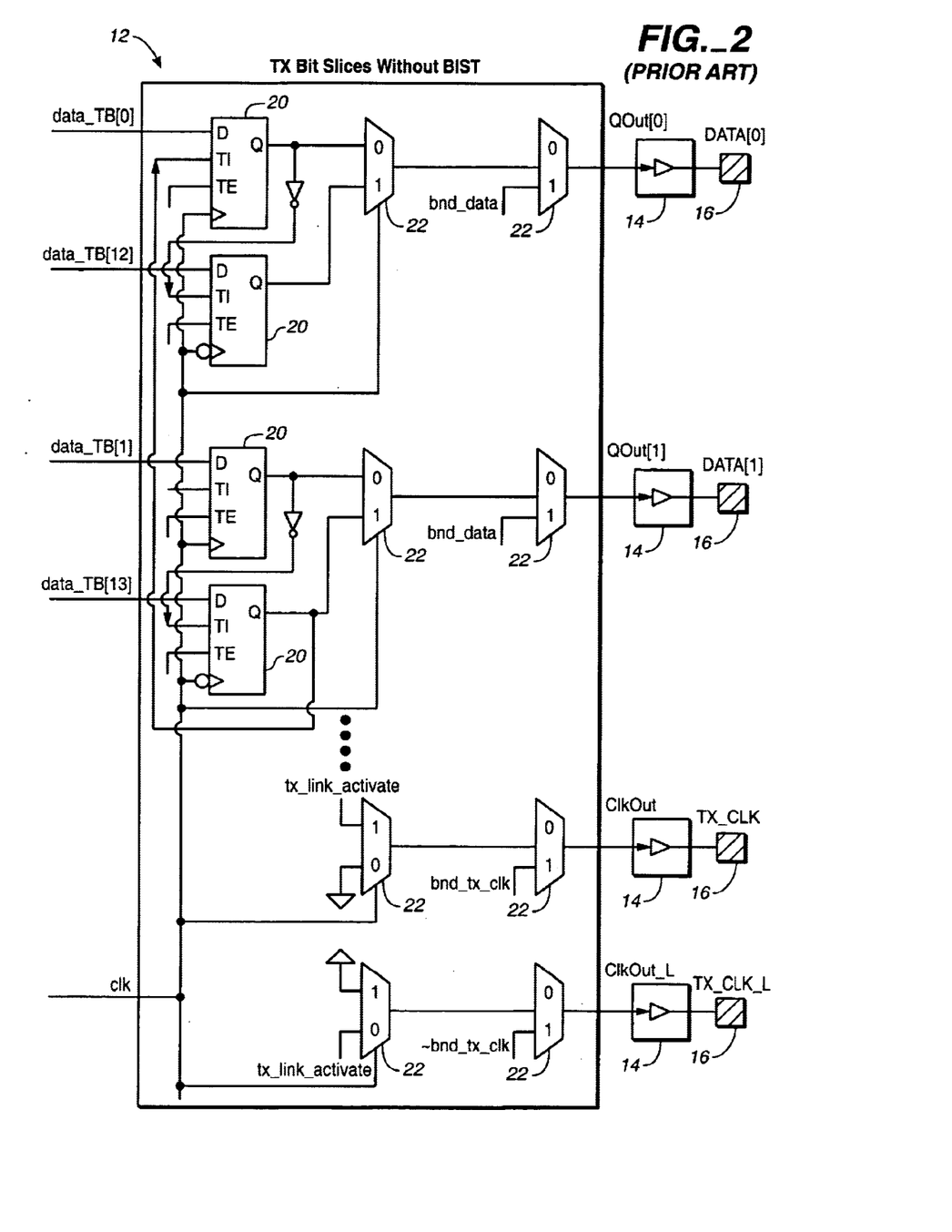
FIG. 2 is a schematic diagram of a prior art transmitter bit slices.

A schematic diagram of a conventional transmitter (TX port) 10 is shown in FIG. 1. Shown in FIG. 2 are bit slices relating to the conventional TX port 10 shown in FIG. 1. As shown in FIGS. 1 and 2, a conventional TX port 10 includes transmitter (TX) logic 12, output buffers 14 and output pads or pins 16. As shown in FIG. 1, a conventional TX port 10 also includes a transmitter (TX) boundary scan cell 18. The TX logic 12 includes a plurality of flip flops 20 and multiplexers 22 (see specifically FIG. 2 which shows a portion of the TX logic 12 in more detail). The TX logic 12 is configured to receive data input signals 24 and supply data and clock output signals 26 to the output buffers 14 and output pins 16.

As shown in FIGS. 1 and 2, a conventional TX port 10 does not include any built-in self test logic. The structure of a conventional receiver (RX port) is much the same, and does not include any built-in self test logic. Instead, the signals at the IO pins (16 in FIGS. 1 and 2) of a conventional SSIO interface must be tested using one of the foregoing techniques, which presents disadvantages, some of which have been discussed above.

OBJECTS AND SUMMARY

A general object of an embodiment of the present invention is to provide a built-in self test implementation for testing the speed and timing margins of the IO pins of a SSIO interface.

Another object of an embodiment of the present invention is to provide a test implementation which provides that a high speed SSIO interface can be tested in production with better accuracy than conventional ATE can achieve.

A further object of an embodiment of the present invention is to provide a test implementation which provides that the high cost associated with high accuracy ATE can be avoided.

Still yet another object of an embodiment of the present invention is to provide a built-in self test implementation which is designed to be self-contained in each SSIO interface.

Another object of an embodiment of the present invention is to provide a versatile built-in self test implementation which provides that the test feature is portable to all VLSI chips that instantiate the ports.

A further object of an embodiment of the present invention is to provide a built-in self test implementation which provides that all the built-in self test logic is implemented inside the hard macro of a SSIO interface.

Another object of an embodiment of the present invention is to provide a test implementation which is designed not only for production tests but also to be used in SSIO characterization.

A further object of an embodiment of the present invention is to provide a test implementation which is designed not only for production tests but also to be useful in SSIO debug applications.

Yet another object of an embodiment of the present invention is to provide a test implementation for a SSIO interface which is designed to be a single-pass production technique.

Briefly, and in accordance with at least one of the foregoing objects, an embodiment of the present invention provides a SSIO interface, such as a TX or RX port, which includes built-in self test logic configured to test the speed and accuracy of data and clock signals of the interface and generate at least one output signal depending on the result of the test.

Preferably, the built-in self test logic includes a pseudo-random pattern generator which is configured to generate input sequences. Buffers are connected to the IO pins and receive the input sequences. The buffers are also connected to multiple input signature registers, and the multiple input signature registers are configured to receive the input sequences from the pseudo-random pattern generator and generate signatures. Preferably, the pseudo-random pattern generator includes two sets of linear feedback shift registers and two sets of multiple input signature registers are provided—a first set corresponding to a rising edge, and a second set corresponding to a falling edge. Comparators are provided to compare the signatures generated by the pseudo-random pattern generator to expected vector values and generate at least one pass/fail output signal. Preferably, at least one programmable delay cell is disposed between each buffer and the multiple input signature registers, and the programmable delay cells provide that propagation delays can be set either externally or by using on-chip registers, such as JTAG registers. By adjusting the relative positions of an edge of a clock signal and an edge of a data signal, timing margin tests can be conducted.

Preferably, a standalone calibration circuit is initially connected to the programmable delay cells and the calibration circuit is configured to determine the actual delay associated with the programmable delay cells. Thereafter, the actual delay is taken into account when performing the timing margin tests. Preferably, the comparators which are included in the logic include a first comparator connected to the pseudo-random pattern generator and configured to receive a stop pattern vector signal, wherein the first comparator is in communication with a controller, and the controller is configured to interrupt the test in response to the first comparator receiving the stop pattern vector signal. Preferably, a second comparator is connected to a multiple input signature register and is configured to receive an expected vector signal corresponding to a falling edge, where the second comparator is configured to compare the expected vector signal with signatures received from the multiple input signature register and generate a pass/fail signal in response thereto. Preferably, a third comparator is also provided to receive an expected vector signal corresponding to a rising edge and compare the expected vector signal with signatures received from the multiple input signature register and generate a pass/fail signal in response thereto.

Also provided is a method of testing the speed and accuracy of data and clock signals of a SSIO interface by looping the data and clock signals to built-in self test logic in the interface, and using the built-in self test logic to test the speed and accuracy of the data and clock signals. Ideally, the test is run and then stopped, and then it is determined whether there was a failure during the test. In a test run, this process may be repeated several times, wherein if there was a failure during the test, the test is re-started and then stopped at an earlier point in time. By repeating the process, a debugging operation can be performed. In a production run, the test is run using predetermined values in a go/no-go type of test.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Figures 3, 3A:
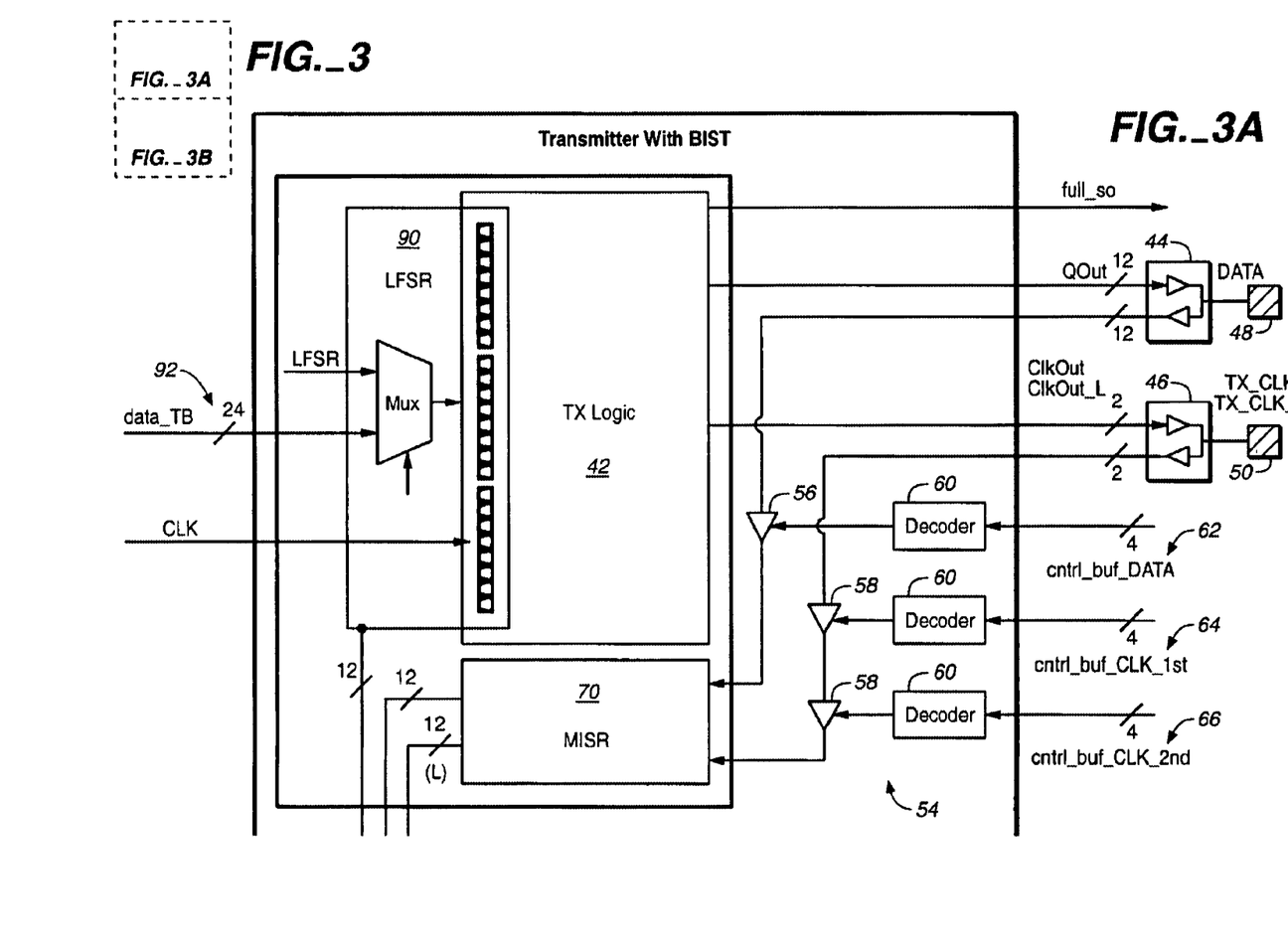
FIG. 3 is a schematic diagram of a transmitter which includes built-in self test structure in accordance with an embodiment of the present invention.
Figure 3B:
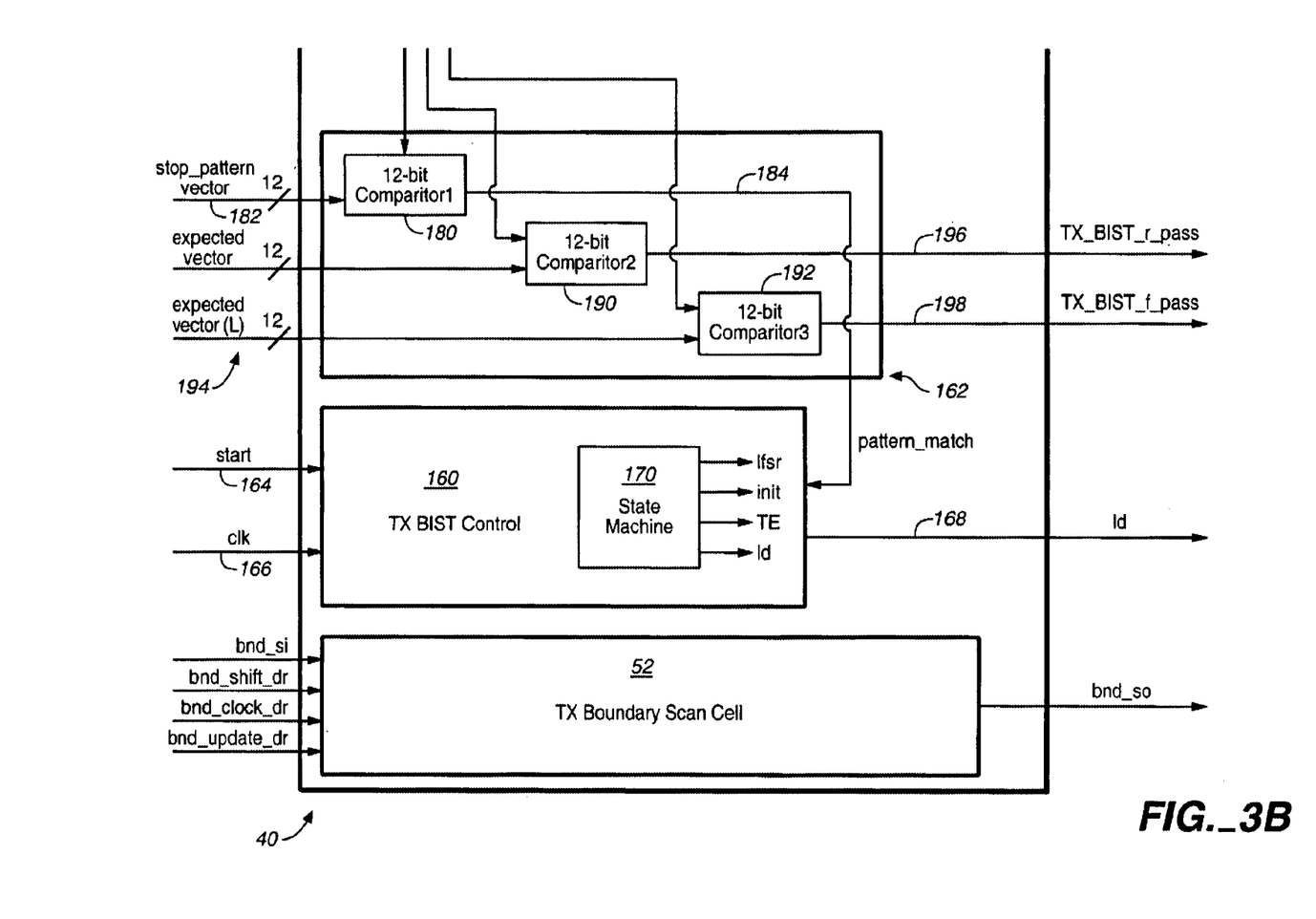
Figure 4:
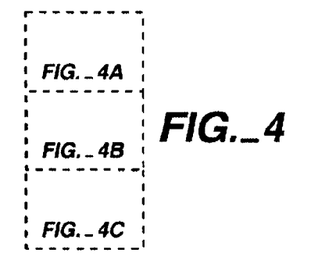
FIG. 4 is a schematic diagram of bit slices relating to the transmitter shown in FIG. 3.
Figure 4A:
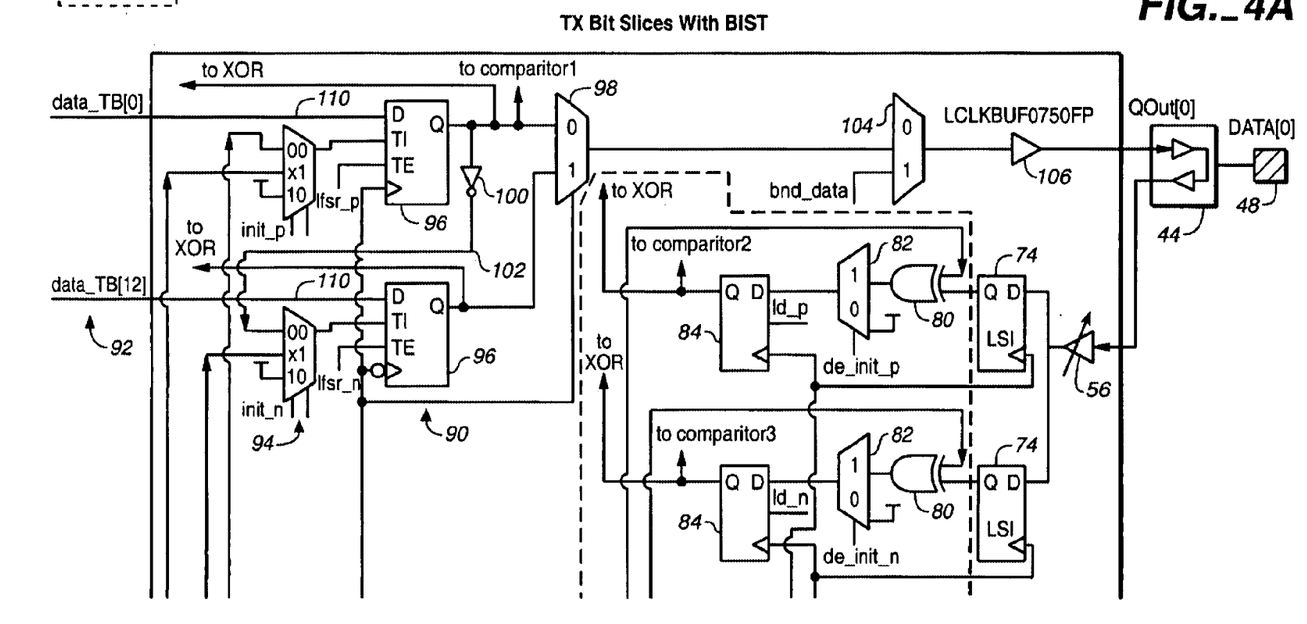
Figure 4B:
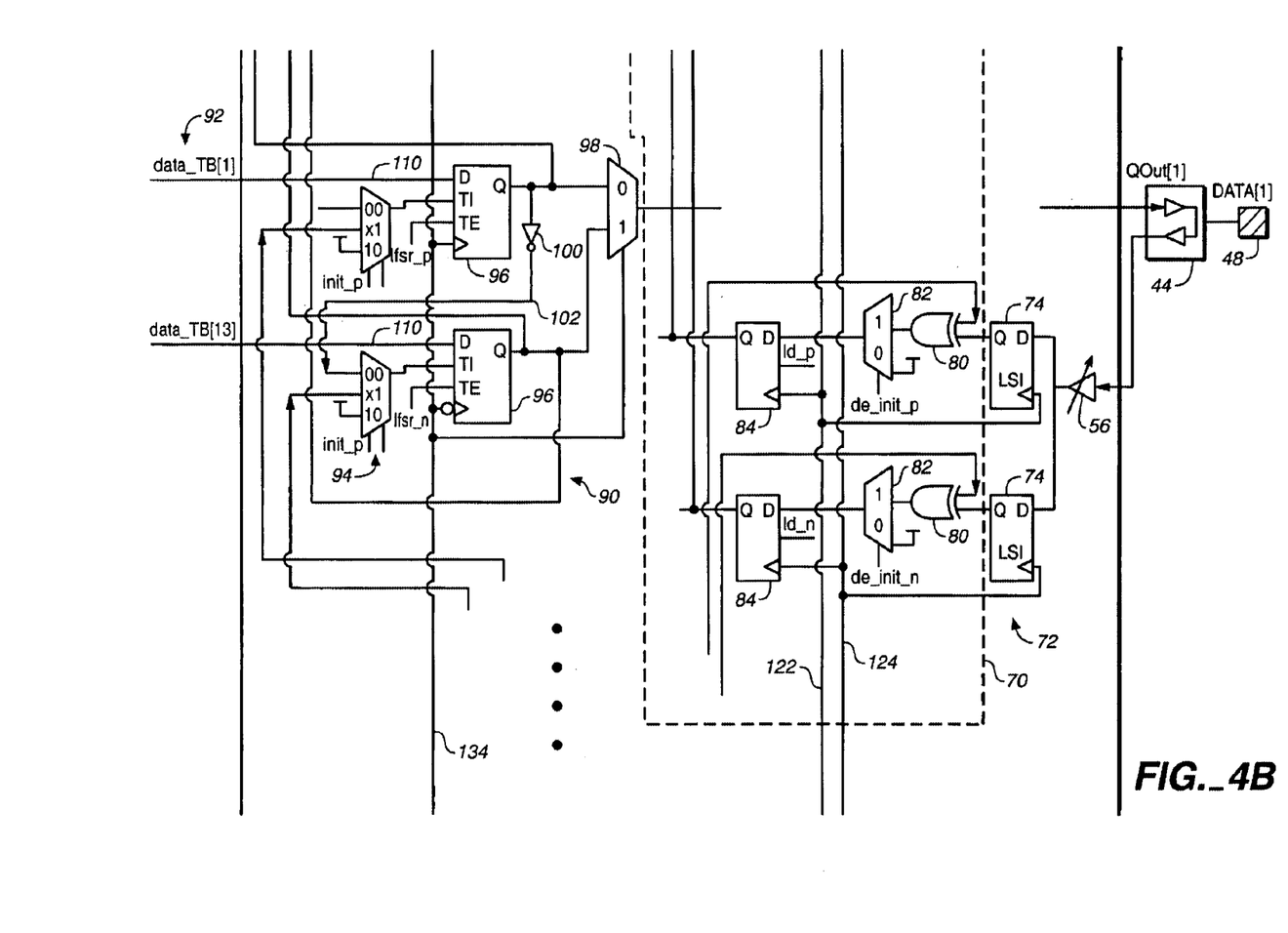
Figure 4C:
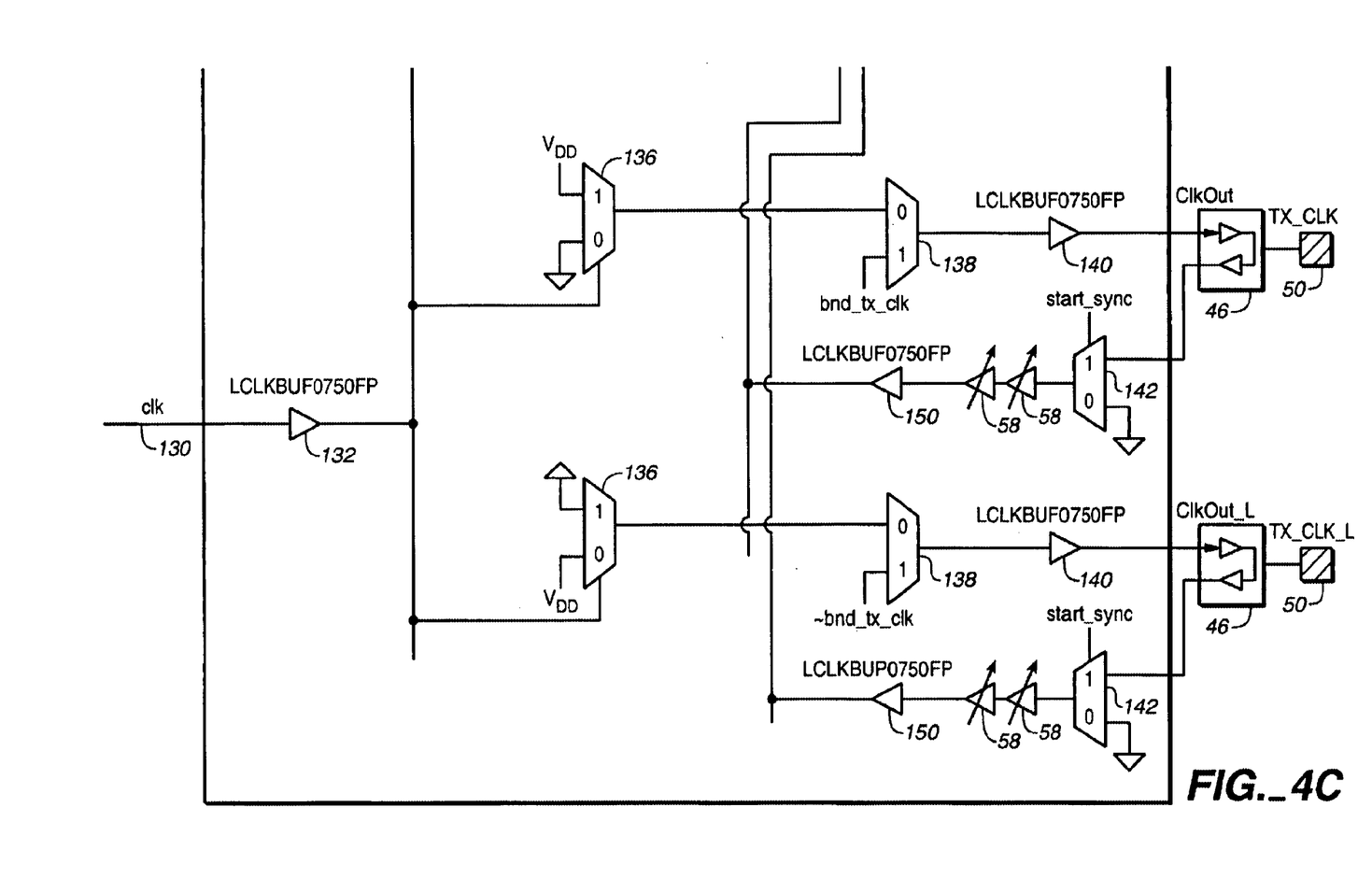

An SSIO interface which is in accordance with an embodiment of the present invention is illustrated in FIG. 3. Specifically, FIG. 3 illustrates a transmitter (TX port) 40 which is in accordance with an embodiment of the present invention, and FIG. 4 shows bit slices relating to the TX port 40. As will be described more fully later herein, the present invention may also be embodied in a receiver (RX port). Regardless, the present invention provides a built-in self test (BIST) implementation for an SSIO interface for testing the speed, accuracy and timing margin of IO signals. As a result of implementing a built-in self test, the high cost associated with high accuracy ATE can be avoided. Preferably, the test implementation provides that a high speed SSIO interface can be tested in production with better accuracy than conventional ATE can achieve. Additionally, the test implementation is preferably designed to be a single-pass production technique, and is designed not only for production tests, but also to be used in SSIO characterization and SSIO debug applications.

The TX port 40 shown in FIG. 3 will now be described. As shown in FIGS. 3 and 4, in addition to transmitter (TX) logic 42, output buffers 44, 46, output pads or pins 48, 50 and a transmitter (TX) boundary scan cell 52, the TX port 40 includes a loopback scheme 54 that is associated with the output pads 48, 50. The loopback scheme 54 provides that each output signal is sent back through a buffer into the TX port logic 42. The loopback scheme 54 includes at least one buffer which is provided between each output pad 48, 50 and the TX port logic 42. As shown in FIGS. 3 and 4, one buffer 56 may be provided between each data pad 48 and the TX port logic 42, and two buffers (i.e. a clock tree) 58 may be provided between each clock pad 50 and the TX port logic 42. Of course, a different number of buffers may be used between each of the pads and the TX port logic 42. A decoder 60 is in communication with each buffer 56, 58, and such configuration provides that the buffers 56, 58 are effectively programmable delay cells. Preferably, the decoders 60 are configured such that each is configured to receive different control signals 62, 64, 66, wherein the signals are provided to the decoders 60 in order to adjust the delay associated with each buffer 56, 58 and perform timing margin tests. The control signals 62, 64, 66 can be supplied externally or by on-chip registers, such as JTAG registers.

As shown in FIGS. 3 and 4, the buffers 56, 58 are connected to a Multiple Input Signature Register (MISR) 70, and deserialization logic 72 is disposed between each data output buffer 56 and the MISR 70. As shown in FIG. 4, the deserialization logic 72 may consist of flip flops 74. The deserialization logic 72 is configured to generate two full cycle signals. After deserialization, the signals are captured in the MISR 70. As shown in FIG. 4, the MISR includes circuitry corresponding to rising edge and falling edge, and each circuitry includes a pair of XOR gates 80 which is configured to receive the feedback signal from the deserialization logic 72. The XOR gates are connected to multiplexers 82 which provide signal to flip flops 84.

Linear Feedback Shift Registers (LFSR's) 90 are provided in communication with the TX logic 42, and are configured to receive the data input signals 92. Specifically, as shown in FIG. 4, a set of two LFSR's 90 (one for rising edge and one for falling edge) is configured to receive each data signal pair. Each LFSR 90 includes a pair of multiplexers 94 in communication with a pair of flip flops 96. Each pair of flip flops 96 is connected to a serialization multiplexer 98. An invertor 100 is provided on signal line 102. Each serialization multiplexer 98 is connected to another multiplexer 104 (only one shown in FIG. 4) which selects between a signal it greceives from multiplexer 98 and boundary scan data ("bnd_data"). Each multiplexer 104 is connected to a buffer 106 which is, in turn, connected to a corresponding output pad 44. The flip flops 96 are capable of switching between a normal operating mode and a built-in self test (BIST) mode. During normal operation, signal 110 ("D") is used by the flip flops 96. In test mode, BIST controller switches the flip-flops 96 to receive data from the TI port, and thus converts the flip-flops 96 to a linear feedback shift register (LFSR) through the multiplexers 94. The reconfigured LFSR acts as the pseudo random pattern generator. At the beginning of test mode, the BIST controller initializes the flip-flops 96 with a fixed initial value as the seed for the LFSR. Then, the LFSR runs through the pseudo random sequences for the rest of the test mode until the pattern in the LFSR matches the stop pattern. Switching the flip flops 96 from normal operating mode to BIST mode covers the real TX port timing, including clocking, and provides efficiency with regard to gate count. The sequences that are generated by the pseudo-random pattern generators interleave, are received by the output buffers 44 and are ultimately fed back into the TX port 40 (via the loopback scheme 54). The sequences can be tuned in the design phase by setting different initial values in the LFSR's 90, in order to generate desired signal transitions and simultaneous switching conditions.

As shown in FIG. 4, clock signals are provided to the MISR 70 and to the deserialization logic 72 between the data output buffers 44 and the MISR 70 (see leads 122, 124). Preferably, the clock signals which are fed to these devices are accurately balanced for minimum skew and with proper delay, and are used by the MISR 70 to capture the output signals which are fed back into the TX port 40. As discussed above, the deserialization logic 72 is configured to generate two full cycle signals. These signals then go into the MISR 70, wherein circuitry is provided for rising edge and for falling edge, each built with a LFSR 90, that contains the BIST signatures throughout the BIST operation. Preferably, two separate clock signals are provided, one for falling edge and one for rising edge. While one clock signal (along lead 122) is provided to the deserialization logic 72 and flip flops 84 in the circuitry in the MISR 70 relating to the rising edge, the other clock signal (along lead 124) is provided to the deserialization logic 72 and flip flops 84 in the circuitry in the MISR 70 relating to the falling edge.

Figure 6:
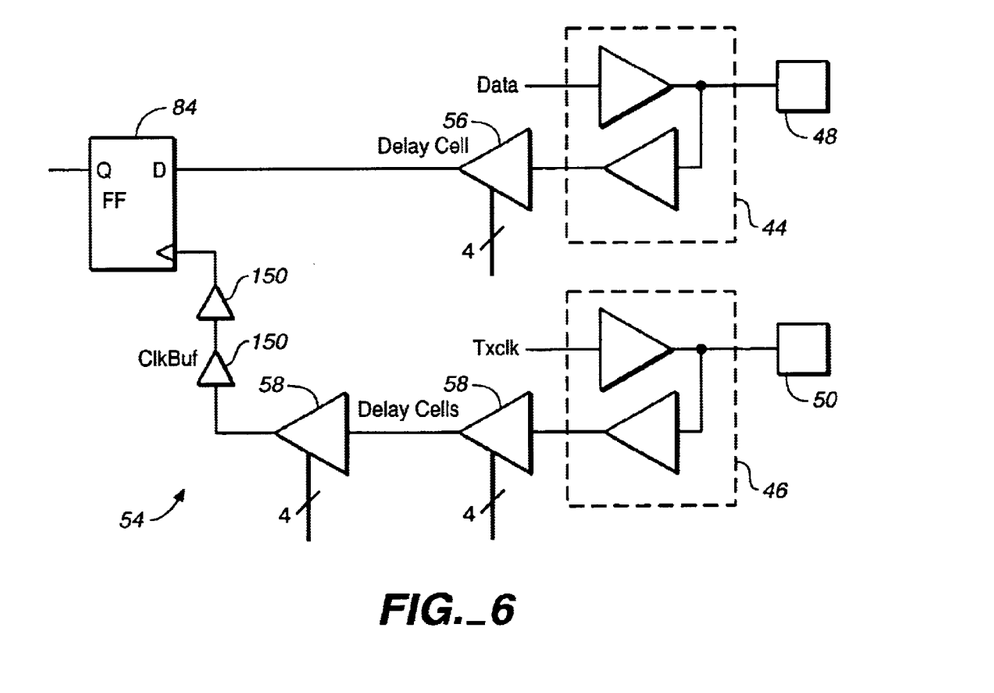
FIG. 6 is a schematic diagram of a transmitter loop back circuit relating to the transmitter shown in FIG. 3.

As shown in FIG. 4, a clock signal ("clk") 130 is provided and the clock signal 130 is received by a buffer 132. The clock signal 130 is thereafter provided to the flip flops 96 of the LFSR's 90 and to the serialization multiplexers 98 (along lead 134). The clock signal 130 is also received by a first set of multiplexers 136 which is connected to a second set of multiplexers 138. Each multiplexer 138 is connected to a buffer 140, and the buffers 140 are ultimately connected to the clock output buffers 46. The clock signals from the output buffers 46 are looped back to the TX port 40 to multiplexers 142 which are connected to the programmable delay cells (i.e. the clock tree) 58. The programmable delay cells 58 are connected to one or more other buffers 150 (FIG. 4 shows one and FIG. 6 shows two) and then the signal is provided to the deserialization logic 72 and to the flip flops 84 in the MISR 70. Specifically, one clock signal (along lead 122) is provided to the deserialization logic 72 and flip flops 84 in the MISR 70 relating to the rising edge, and the other clock signal (along lead 124) is provided to the deserialization logic 72 and flip flops 84 in the MISR 70 relating to the falling edge.

Figure 5:
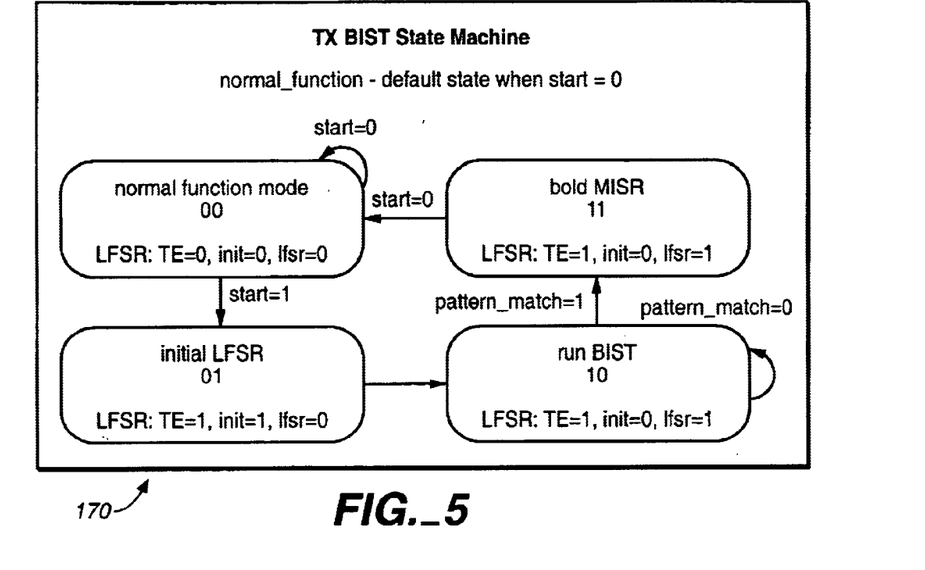
FIG. 5 is a diagram showing, in more detail, the state machine of the transmitter shown in FIG. 3.

The BIST operation is effectively controlled by a controller 160 and comparison logic 162. The controller 160 is configured to receive a start signal (along lead 164) and a clock signal (along lead 166). The start signal 164 initiates the BIST operation and may be provided to the controller 160 either externally or by on-chip registers, such as JTAG registers. The controller 160 generates an output signal "ld" (lead 168) and includes a state machine 170 which provides several output signals ("lfsr", "init", "TE", "ld") for controlling the BIST operation. FIG. 5 illustrates the state machine 170 in more detail.

As shown in FIG. 3, the comparison logic 162 preferably consists of three comparators. A first comparator 180 is configured to receive stop signals ("stop_pattern vector") 182 as well as signals from the LFSR's 90. The first comparator 180 is configured to provide an output signal ("pattern_match") (along lead 184) to the controller 160 and is configured to direct the controller 160 to stop the BIST operation. This eliminates the need to use a local counter to set the cycle count for a BIST run. Furthermore, this allows a stop cycle to be programmable, for example, externally or by using on-chip registers, such as JTAG registers (i.e. the stop pattern vector signal 182 which is provided to the first comparator 180 may be an external signal or may be provided by on-chip registers, such as JTAG registers). The capability to stop the BIST operation in any cycle enables detailed debugging and characterization of the TX port 40, both on the tester and in the system, and significantly enhances the usefulness of the BIST implementation.

The other two comparators 190, 192 are configured to receive expected vector input signals ("expected vector" and "expected vector (L)") 194 as well as signals from the MISR 70. Like the stop signal 182 provided to the first comparator 180, the expected vector input signals 194 can be supplied either externally or using on-chip registers, such as JTAG registers. The two comparators 190, 192 are configured to compare the resulting BIST signatures (received from the MISR's) to the expected signatures (i.e. the expected vector input signals), and generate pass/fail output signals ("TX_BIST_r_repass" and "TX$_{13}$BIST_f_pass") (on leads 196, 198) depending on the outcome of the comparison. The output signals which are generated by the two comparators 190, 192 can be read externally or by on-chip registers, such as JTAG registers.

During BIST operation, the pseudo-random pattern generator (LFSR's 90) generates input sequences. The input sequences go into the serialization logic 98 and the data output buffers 44. Then, the feedback signals are routed back into the TX port 40 to deserialization logic 72. After descrialization, the signals are captured in the MISR 70. The comparison logic 162 (i.e. the three comparators 180, 190, 192) are used to control the BIST stop cycle and for BIST signature comparison. By stopping the operation at different points and determining whether an error has occurred, a debugging operation can be performed.

Because the loopback uses normal functional paths in the TX port 40, it has very high coverage for DC faults on the paths. Actual stuck-at fault coverage can be determined based on fault simulation results. The more important coverage measure for the loopback BIST is the coverage of AC or timing faults. Again, since the normal functional paths (including all data and clock paths) are used, all the timing uncertainties in the TX port are covered. These include the ASIC core clock jitter and duty cycle distortion, TX port clock skew, jitter and duty cycle distortion, and data skew, jitter and duty cycle distortion. Because the feedback path originates from the output pads 48, 50, timing uncertainties due to the package loading is also covered. Although the effect of package loading is not covered as directly as observed at the package pin level, correlations can be made between the internal and external effects. The above AC coverage includes all of the sources of timing uncertainty for a TX port, thus the AC coverage of the loopback BIST is high.

As discussed above, the BIST scheme is designed to test the output signals of the TX port for speed and margin. The margin test capability effectively eliminates the need for highly accurate ATE, as well as provides a very cost effective way to perform key AC tests in a production environment. The fact that the BIST scheme is also designed for debugging provides that more efficient chips and systems can be designed relatively quickly, and that they can be designed more easily.

The programmable delay cells 56, 58 in the feedback paths for both clock and data are used to control the relative timing between the feedback data and clock edges. Based on either simulation or silicon characterization results, the clock edges can be positioned at or near the center of the feedback data eye opening (between signal transitions), so that the correct feedback data can be captured in the feedback flip flops 84. This ensures that the loopback test runs at the maximum speed. Performing an at-speed test of the TX port 40 ensures that the output buffers 44, 46 work properly at the desired speed.

For a TX port, the key timing parameters include skew across the output data pins, duty cycle distortion and jitter at each data pin. All of these factors contribute to the timing uncertainty of the TX port, and adversely affect the cycle time which can be achieved. The timing uncertainty of a TX port can be defined as the worst case deviation of any data edges observed at the output pins in a transmitter port from the clock edges observed at the clock output pins.

To test for timing margin, it is critical to be able to measure, under worst case switching and operating conditions, the boundary of the timing uncertainty of all the data pins with respect to clock pins. With the programmable delay cells 56, 58, the clock edges can be positioned relative to the data edges with desired timing distance such that failure from the worst data edge can be captured. This can be done on both sides of the data edges so that the boundaries of the timing uncertainty can be determined in characterization. For production, a go/no-go type of test can be performed based on a pre-determnined programmable delay cell value.

Figure 7:
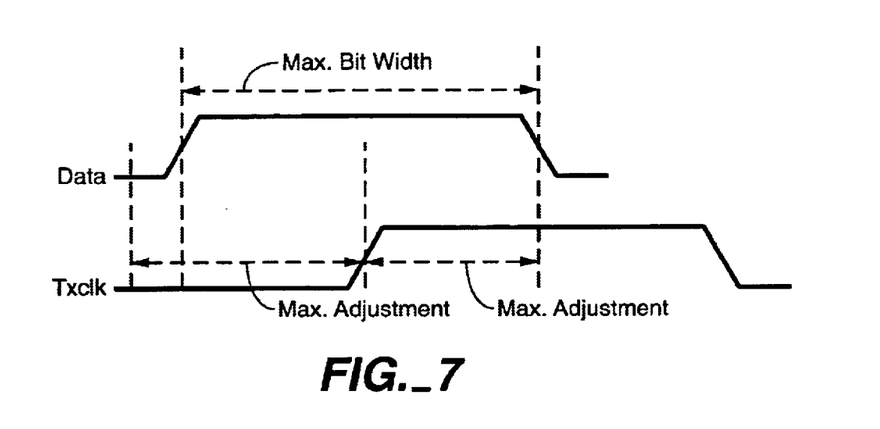
FIG. 7 is a waveform for one bit relating to the transmitter loop back circuit shown in FIG. 6.

FIG. 6 generally illustrates, in a simplified form, the structure for enabling the performing of timing margin tests. Specifically, FIG. 6 generally illustrates, in a simplified form, the loopback circuit which has been described above. FIG. 7 provides a waveform for one bit ("Data" and "Txclk") relating to the loopback circuit shown in FIG. 6. As shown in FIG. 6 (see also FIGS. 3 and 4), two programmable delay cells 58 are provided on the clock feedback path to provide a sufficient programmable delay range to facilitate timing margin testing.

Figure 8:
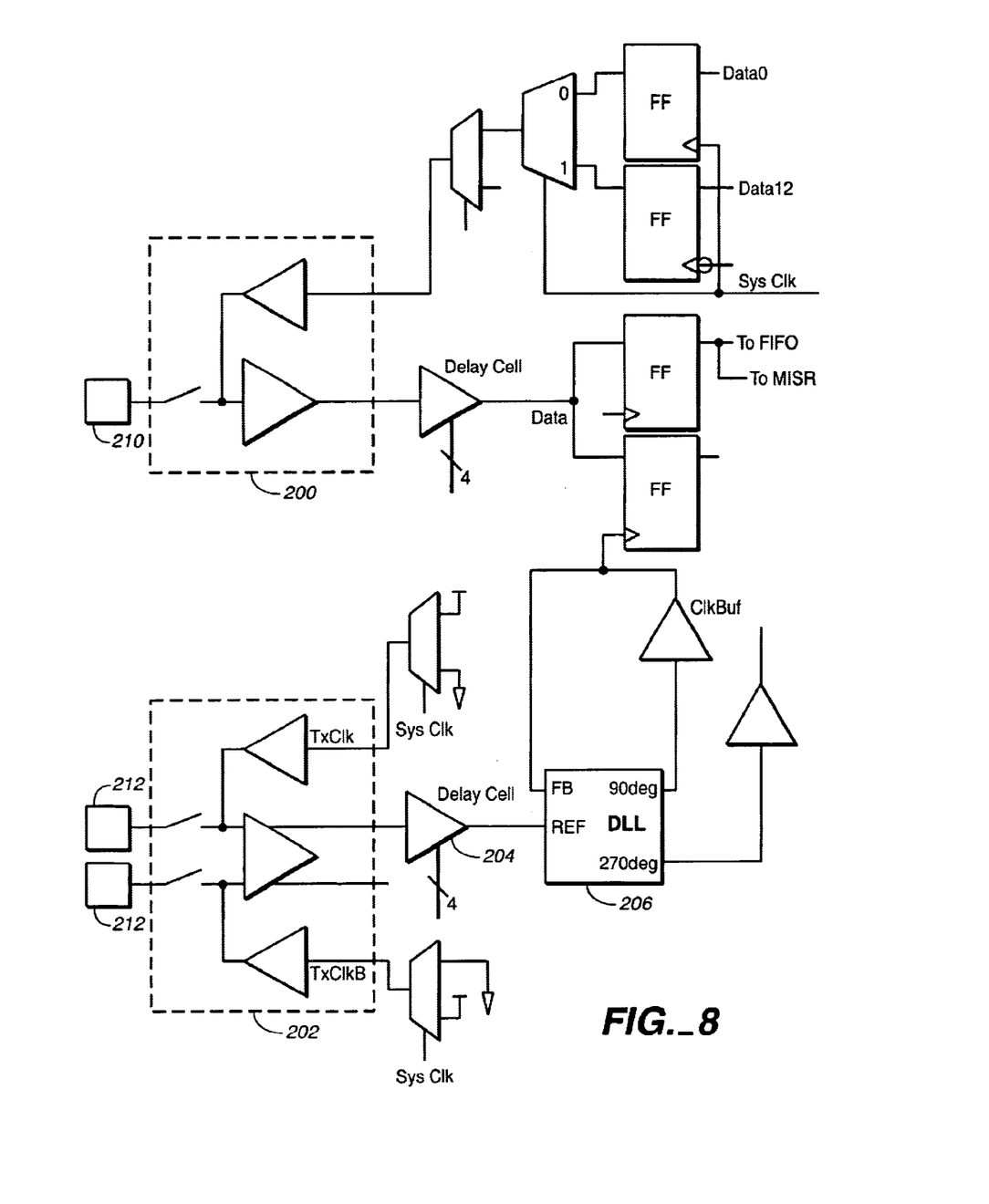
FIG. 8 is a schematic diagram of a receiver loop back circuit.

As discussed above, while FIGS. 3 and 4 illustrate a TX port 40 which is in accordance with an embodiment of the present invention, the present invention may also be embodied in a receiver (a RX port). The loopback BIST implementation in a RX port is very similar to that in a TX port, which has been described above. As shown in FIG. 8, the signals at input buffers 200, 202 are looped back into the RX port in much the same way the signals at the output ports 44, 46 are looped back into the TX port 40, and the external input path is switched off in BIST mode. Additionally, like in a TX port, a pseudo-random pattern generator built with two LFSR's and a serialization multiplexer is employed. The signals that are captured in the first level of input flip flops are then fed to the MISR, just like in the TX port. The same control mechanisms as in the TX port are used to control the BIST operation in a RX port.

Figure 9:
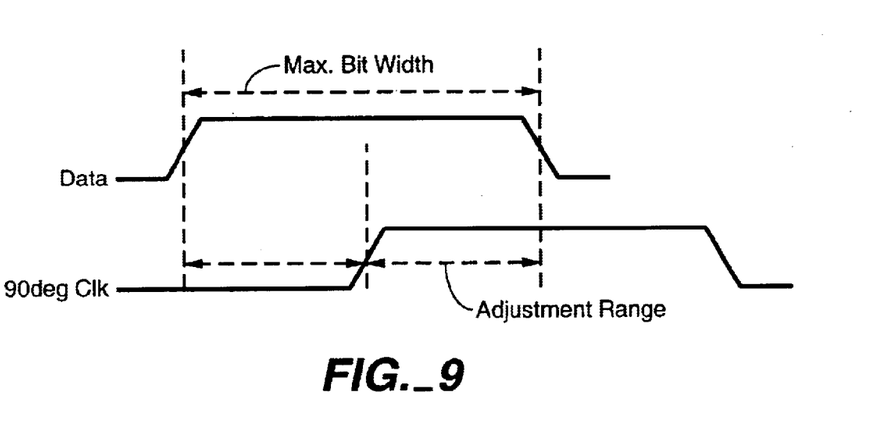
FIG. 9 is a waveform for one bit relating to the receiver loop back circuit shown in FIG. 8.

For a RX port, the normal functional requirements of the deskew circuits can be used for timing margin tests in the BIST mode. If no deskew circuits are provided, dedicated delay cells are needed. On the other hand, if deskew circuits are provided, then the deskew circuits and BIST circuitry can share the same delay cells. FIG. 8 illustrates a loopback circuit wherein deskew programmable delay cells are used for margin tests, and effectively illustrates the differences between the receiver port BIST implementation and the TX port BIST implementation previously described. FIG. 9 provides a waveform for one bit ("Data" and 90deg Clk") relating to the loopback circuit shown in FIG. 8. As shown in FIG. 9, in a RX port, since there is only one programmable delay cell 204 on the clock path, the programmable delay range from the delay cell 204 alone may not be sufficient. If this is true, then the phase margining capability of a DLL 206 which is provided in the RX port can be utilized for additional timing offset between clock and data edges.

With both the TX port and RX port, the loopback tests are intended as AC tests used for at-speed and timing margin tests. Because of the very high data rates, careful electrical considerations must be given to not only on-chip signal paths, but also the interface between the DUT and the tester environment, including socket, loadboard, and tester pin electronics.

During loopback tests in a RX port, the signal pads 210, 212 are isolated from the input buffers 200, 202, so the external environment does not affect the loopback signal integrity. However, loopback tests in a TX port 40 provides that the loopback signal is taken directly from the output pads 44, 46, so the interface between the DUT and the tester loadboard and the tester pin electronics play a critical role in determining the timing margin test accuracy that can be achieved by the loopback tests.

One of the goals of the loopback BIST tests is to achieve single insertion production tests, meaning that all DC and AC tests are performed by inserting the DUT into a loadboard and tested on a tester once. While the loopback BIST implementation described above is used to perform AC tests on the SSIO ports, DC tests are preferably performed by the tester. For this reason, an electrical connection between the DUT and tester must be provided on the loadboard. This connection results in electrical interactions that can affect the loopback signal integrity on chip and thus adversely affect the timing accuracy which can be achieved.

A typical tester environment consists of the DUT, package, socket, loadboard and the tester pin electronics, and various termination schemes are possible for output buffers in a tester environment. Preferably, a scheme with no external termination is used as this provides the best loopback signal integrity and the least jitter. In a scheme with no external termination, the active drive of the tester pin electronics is turned off during loopback BIST operation and the entire signal path is terminated with a built-in 50 ohm termination resistor inside the tester. During DC tests, the active drive is turned on in the tester pin electronics.

In order to achieve high accuracy timing margin testing, the programmable delay cells (in either a TX port or RX port) must be calibrated. This is due to the fact that both the total delay and the delay for each programmable step on the delay cell can vary with process, voltage, and temperature (PVT) conditions. Therefore, the delay cells on each ASIC can have slightly different delay step size and total delay range. Consequently, additional margin would need to be reserved in a go/no-go test if the same programmable delay values were to be used in different ASIC's. By calibrating the delay cells in each device, maximum accuracy can be achieved since the programmable delay values can be set differently for each device to be within a small range of an absolute timing value specified for an SSIO port.

Figure 10:
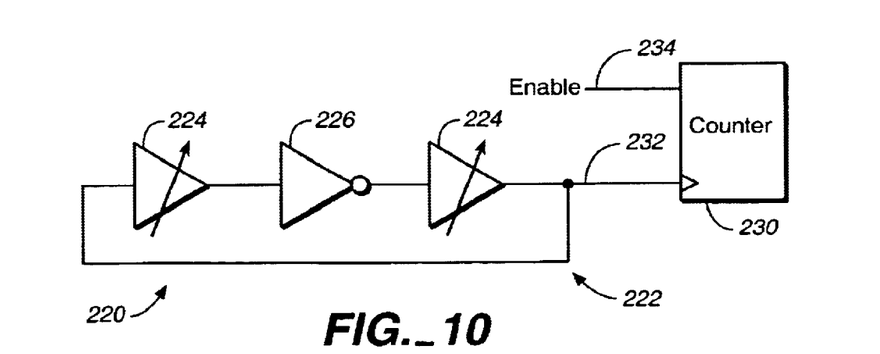
FIG. 10 is a schematic diagram of a programmable delay cell calibration circuit.

FIG. 10 illustrates one possible calibration scheme 220, and the scheme involves placing the programmable delay cell in selected die locations. An oscillating delay cell loop 222 is provided and consists of one or more delay cells 224 in a loop 222 that has an inverter 226 (i.e. an inverting loop). The oscillator delay cell loop 222 is connected to a counter 230, and the output 232 of the oscillator drives the counter 230. Initially, the counter 230 receives an enable signal 234 and then during calibration, the counter 230 is allowed to run for a fixed amount of time. At the end of the counter run time, the counter value is read, and precise delay values for the delay cell(s) 224 can then be determined. This device-specific delay value is then used to determine how the controls for the delay cell(s) should be set to achieve the specified delay value. The delay cell calibration circuit shown in FIG. 10 can be used as a process monitor as well as for general purpose information.

For timing margin tests with programmable delay cell calibration, the achievable accuracy for the loopback test should be the step size of the delay cell. In one possible scheme, the delay cells are designed to have a total range of about 730 ps and step size of about 50 ps for nominal PVT conditions. Thus, the achievable timing accuracy for a loopback test is about 50 ps. The step size of the delay cells can be smaller if desired. This is significantly better than can be achieved on any typical high accuracy ATE equipment available today.

The BIST scheme described above can test the IO pins of a SSIO port for both speed and accuracy. This technique provides that high speed SSIO interfaces can be tested in production with much better accuracy than any typical ATE can achieve. At the same time, the high cost associated with high accuracy ATE can be avoided because the SSIO interfaces tend to be the highest speed components in most VSLI chips containing SSIO interfaces.

The SSIO BIST implementation described above is designed to be self-contained in each TX and RX port, and the test feature is portable to all VLSI chips that instatiate the ports, making the BIST implementation versatile. The BIST implementation has all the BIST logic implemented inside the hard macro of the TX or RX port. As described above, the external signals which are needed include a start signal, expected vector count and expected signature vectors, all of which can be implemented externally or as part of the ASIC JTAG functions.

As discussed above, the BIST scheme is provided by an IO loopback scheme for all IO pins in an SSIO port. For an input pin, the loopback involves establishing a forced signal path into the input buffer such that a signal can be forced through the input buffer into RX port normal functional logic from a BIST pattern generator. For an output pin, the loopback involves sending an output signal back into the TX port logic through an extra buffer that is attached on the output signal path. As also discussed above, the implementation provides that both speed and timing margin tests can be performed. The loopback BIST implementation can cover true timing behavior of the TX and RX ports. For the TX port, the loopback includes the complete output buffers and pads, so that the package and system loading can be represented by the loopback signal in timing tests. For the RX port, the loopback includes almost the entire input buffer and all of the clocking structures (including the DLL) in the RX port.

As described above, the BIST implementation is designed not only for production tests, but also to be used in SSIO characterization. This is because programmable delay cells are used in timing margin tests, and then by setting different delay values for these delay cells, SSIO pin and port timing can be measured. The BIST implementation is also designed to be useful in SSIO debug operations. Specifically, the BIST tests can be stopped with a programmable stop pattern any time during a test. This allows for effective and exhaustive search of the failing cycle and can help locate failures quickly. The stop patterns can be programmed either on the ATE or in the system, thus allowing the debug operations to be carried out even in the DUT target system.

The present invention provides a Built-in Self Test scheme for speed and timing margins for source synchronous IO interfaces, including both transmit and receive ports. The present invention also provides for the use of loopback paths for data pins and clock pins so that, in test mode, data and clock paths in a transmit port will feed into deserialization logic, and data and clock paths in a receive port will come from serialization logic. The loopback paths can either be attached to normal functional signal or clock paths, which include the pads and traces to package pins, or be separated from the chip pads and package traces. Also provided is the use of at least one pattern generator before the serialization logic as test pattern source, so that test sequences can be generated on-chip. Also provided is the use of at least one signature register or pattern comparator after the deserialization logic, so that test results can be captured on-chip, not off-chip by a tester. Also provided is the use of at least one programmable delay cell on data paths between serialization logic and deserialization logic, and the use of at least one programmable delay cell on either normal clock paths or loopback clock paths before deserialization logic. The programmable delay cells allow the edges of clock and data signals that go into deserialization logic to be shifted relative to each other in test mode. The programmable delay cells' propagation delay settings can be controlled externally via chip pins or internally via on-chip registers. The programmable delay cells on the clock paths and each data path have combined programmable range that is greater than the amount of time between two signal transitions determined by the desired data transition rate, such that the clock edge can be shifted across or past the data edges on both sides, thus ensuring that the complete timing margin of a source synchronous IO interface covered by the loopback test can be tested. Preferably, the programmable delay cells are controlled such that the timing distance between clock edges and data edges is used for testing timing margins of a source synchronous IO interface. The programmable delay cells can also be calibrated on-chip such that their actual delays can be determined per-chip and can be used to determine settings for programmable delay cells in timing margin tests. The present invention also provides the use of a programmable stop pattern and a comparator to compare test input vector and the stop pattern so that a test can be stopped in any desired cycle for failure diagnosis and debug.

In contrast to other testing techniques, the BIST implementation described above is intended to be a single-pass production test technique. This allows all necessary AC and DC tests to be performed in one test run on the ATE. This minimize production test costs which is important, especially in low production run situations.

While embodiments of the present invention are shown and described, it is envisioned that those skilled in the art may devise various modifications of the present invention without departing from the spirit and scope of the appended claims.

What is claimed is:

1. A Built-in Self Test scheme for speed and timing margins for a source synchronous IO interface, wherein the scheme includes separate programmable delay cells on each clock and data path which thereby allows the edges of clock and data signals to be shifted relative to each other in test mode.

2. A Built-in Self Test scheme as recited in claim 1, wherein the scheme is implemented in a transmit port.

3. A Built-in Self Test scheme as recited in claim 2, wherein the scheme includes loopback paths for data pins and clock pins so that, in test mode, data and clock paths in the transmit port will feed into deserialization logic.

4. A Built-in Self Test scheme as recited in claim 1, wherein the scheme is implemented in a receive port.

5. A Built-in Self Test scheme as recited in claim 4, wherein the scheme includes loopback paths for data pins and clock pins so that, in test mode, data mid cluck paths in the receive port will come from serialization logic.

6. A Built-in Self Test scheme as recited in claim 1, wherein the scheme includes loopback paths for data pins and clock pins, and the loopback paths are attached to normal functional signal or clock paths, which include the pads and traces to package pins.

7. A Built-in Self Test scheme as recited in claim 1, wherein the scheme includes loopback paths for data pins and clock pins, and the loopback paths are separated from the chip pads and package traces.

8. A Built-in Self Test scheme as recited in claim 1, wherein the scheme includes at least one pattern generator before serialization logic as test pattern source, so that test sequences are generated on-chip.

9. A Built-in Self Test scheme as recited in claim 1, wherein the scheme includes at least one signature register or pattern comparator after deserialization logic, so that test results can be captured on-chip, not off-chip by a tester.

10. A Built-in Self Test scheme as recited in claim 1, wherein the scheme includes at least one programmable delay cell on data paths between serialization logic and descrialization logic, and at least one programmable delay cell on either normal clock paths or loopback clock paths before deserialization logic.

11. A Built-in Self Test scheme as recited in claim 1, wherein the programmable delay cells' propagation delay settings can be controlled externally via chip pins or internally via on-chip registers.

12. A Built-in Self Test scheme as recited in claim 11, wherein the programmable delay cells on the clock paths and each data path have combined programmable range that is greater than the amount of time between two signal transitions determined by the desired data transition rate, such that the clock edge can be shifted across or past the data edges on both sides, thus ensuring that the complete timing margin of a source synchronous IO interface covered by the loopback test can be tested.

13. A Built-in Self Test scheme as recited in claim 11, wherein the programmable delay cells are controllable such that the timing distance between clock edges and data edges is used for testing timing margins of a source synchronous IO interface.

14. A Built-in Self Test scheme as recited in claim 11, wherein the scheme is configured to provide that the programmable delay cells are calibrated on-chip such that their actual delays can be determnined per-chip and can be used to determine settings for programmable delay cells in timing margin tests.

15. A Built-in Self Test scheme as recited in claim 11, wherein the scheme uses a programmable stop pattern and a comparator to compare test input vector and a stop pattern so that a test can be stopped in any desired cycle for failure diagnosis and debug.

16. A source synchronous input/output interface comprising: at least one data pin; at least one clock pin; and at least one programmable delay cell in the interface and in communication with said data pin; at least one programmable delay cell in the interface and in communication with said clock pin, said programmable delay cells configured such that propagation delays are settable such that relative positions of edge of a clock signal and an edge of a data signal are separately shiftable, wherein said source synchronous input/output interface is configured such that timing margin tests are performable.

17. A source synchronous input/output interface as recited in claim 16, further comprising a first buffer connected to said at least one data pin, a second buffer connected to said at least one clock pin, and at least one multiple input signature register, at least one programmable delay cell being disposed between cach buffer and said at least one multiple input signature register.

18. A source synchronous input/output interface as recited in claim 16, said interface configured such that propagation delays are settable externally.

19. A source synchronous input/output interface as recited in claim 16, said interface configured such that propagation delays are settable on-chip.

20. A source synchronous input/output interface as recited in claim 16, further comprising built-in self test logic in the interface and in communication with said at least one data pin and at least one clock pin, said built-in self test logic configured to test data and clock signals of the interface and generate at least one output signal depending on the result of the test.

21. A source synchronous input/output interface as recited in claim 20, said built-in self test logic comprising a pseudo-random pattern generator configured to generate sequences, a first buffer connected to said at least one data pin, a second buffer connected to said at least one clock pin, said first and second buffer configured to receive said sequences generated by said pseudo-random pattern generator and loop said sequences to said built-in self test logic.

22. A source synchronous input/output interface as recited in claim 20, further comprising at least one multiple input signature register, said built-in self test logic further comprising a plurality of comparators connected to said at least one multiple input signature register and said pseudo-random pattern generator.

23. A source synchronous input/output interface as recited in claim 22, further comprising a controller configured to control said built-in self test logic, wherein at least one of said comparators comprises a first comparator connected to said pseudo-random pattern generator and configured to receive a stop signal, said first comparator in communication with said controller, said controller configured to interrupt the test in response to said first comparator receiving said stop signal.

24. A source synchronous input/output interface as recited in claim 23, wherein at least one of said comparators comprises a second comparator connected to said at least one multiple input signature register and configured to receive an expected vector signal corresponding to a falling edge, said second comparator configured to compare said expected vector signal with signatures received from said at least one multiple input signature register and generate a pass/fail signal in response thereto, and wherein at least one of said comparators comprises a third comparator connected to said at least one multiple input signature register and configured to receive an expected vector signal corresponding to a rising edge, said third comparator configured to compare said expected vector signal with signatures received from said at least one multiple input signature register and generate a pass/fail signal in response thereto.

25. A source synchronous input/output interface comprising: at least one data pin; at least one clock pin; built-in self test logic in the interface and in communication with said at least one data pin and at least one clock pin, said built-in self test logic configured to test the data and clock signals of the interface by using programmable delay cells to shift the data and clock signals relative to each other and generate at least one output signal depending on the result or the test.

26. A source synchronous input/output interface as recited in claim 25, further comprising a controller configured to control said built-in self test logic to perform the test.

27. A source synchronous input/output interface as recited in claim 25, said built-in self test logic comprising a pseudo-random pattern generator configured to generate sequences, a first buffer connected to said at least one data pin, a second buffer connected to said at least one clock pin, said first and second buffer configured to receive said sequences generated by said pseudo-random pastern generator and loop said sequences to said built-in self test logic.

28. A source synchronous input/output interface as recited in claim 27, said pseudo-random pattern generator comprising two sets of linear feedback shift registers, said two sets of linear feedback shift registers comprising a first set of linear feedback shift registers corresponding to a rising edge, and a second set of linear feedback shift registers corresponding to a falling edge.

29. A source synchronous input/output interface as recited in claim 27, said built-in self test logic further comprising at least one multiple input signature register configured to receive said sequences from said first and second buffer and generate signatures in response thereto.

30. A source synchronous input/output interface as recited in claim 29, said at least one multiple input signature register comprising a first multiple input signature register corresponding to a rising edge, and a second multiple input signature register corresponding to a falling edge.

31. A source synchronous input/output interface as recited in claim 29, further comprising at least one programmable delay cell disposed between each buffer and said at least one multiple input signature register.

32. A source synchronous input/output interface as recited in claim 31, said programmable delay cells configured such that propagation delays are settable at least one of externally from said interface and on-chip.

33. A source synchronous input/output interface as recited in claim 32, wherein said propagation delays are settable such that relative positions of an edge of a clock signal and an edge of a data signal are shiftable, wherein said source synchronous input/output interface is configured such that timing margin tests are performable.

34. A source synchronous input/output interface as recited in claim 29, said built-in self test logic further comprising a plurality of comparators connected to said at least one multiple input signature register and said pseudo-random pattern generator.

35. A source synchronous input/output interface as recited in claim 34, further comprising a controller configured to control said built-in self test logic, wherein at least one of said comparators comprises a first comparator connected to said pseudo-random pattern generator and configured to receive a stop signal, said first comparator in communication with said controller, said controller configured to interrupt the test in response to said first comparator receiving said stop signal.

36. A source synchronous input/output interface as recited in claim 35, wherein at least one of said comparators comprises a second comparator connected to said at least one multiple input signature register and configured to receive an expected vector signal corresponding to a falling edge, said second comparator configured to compare said expected vector signal with signatures received from said at least one multiple input signature register and generate a pass/fail signal in response thereto, and wherein at least one of said comparators comprises a third comparator connected to said at least one multiple input signature register and configured to receive an expected vector signal corresponding to a rising edge, said third comparator configured to compare said expected vector signal with signatures received from said at least one multiple input signature register and generate a pass/fail signal in response thereto.

37. A method of performing timing margin tests on clock and data signals of a source synchronous input/output interface, said method comprising: using programmable delay cells in the interface to separately shift the relative positions of an edge of a clock signal and an edge of a data signal.

38. A method as recited in claim 37, further comprising setting propagation delays externally.

39. A method as recited in claim 37, further comprising setting propagation delays on-chip.

40. A method as recited in claim 37, further comprising looping the data and clock signals to built-in self test logic in the interface; and using the built-in self test logic to test the data and clock signals.

41. A method as recited in claim 40, further comprising generating at least one output signal depending on the result of the test.

42. A method as recited in claim 40, further comprising using a pseudo-random pattern generator in the interface to generate sequences, providing the sequences to at least one buffer and looping the sequences to said built-in self test logic.

43. A method as recited in claim 42, further comprising using at least one multiple input signature register in the interface, and using a plurality of comparators connected to said at least one multiple input signature register and said pseudo-random pattern generator.

44. A method as recited in claim 43, further comprising using a controller to control said built-in self test logic, wherein at least one or said comparators comprises a first comparator connected to said pseudo-random pattern generator and configured to receive a stop signal said first comparator in communication with said controller, said method further cursing using said controller to interrupt the test in response to said first comparator receiving said stop signal.

45. A method as recited in claim 44, wherein at least one of said comparators comprises a second comparator connected to said at least one multiple input signature register, said method further comprising providing an expected vector signal to said second comparator, said expected vector signal corresponding to a falling edge, using said second comparator to compare said expected vector signal with signatures received from said at least one multiple input signature register and generate a pass/fail signal in response thereto, and wherein at least one of said comparators comprises a third comparator connected to said at least one multiple input signature register, said method further comprising providing an expected vector signal to said third comparator, said expected vector signal corresponding to a rising edge, said method further comprising using said third comparator to compare said expected vector signal with signatures received from said at least one multiple input signature register and generate a pass/fail signal in responds thereto.

46. A method of testing the speed and accuracy of data and clock signals of a source synchronous input/output interface, said method comprising: looping the data and clock signals to built-in self test logic in the interface; and using the built-in self test logic to test the data and clock signals by using programmable delay cells to separately shift the data and clock signals.

47. A method as recited in claim 46, further comprising using a controller to control the built-in self test logic.

48. A method as recited in claim 46, further comprising generating sequences, and providing said sequences to a first buffer which is connected to at least one data pin and a second buffer which is connected to at least one clock pin.

49. A method as recited in claim 48, further comprising using two sets of linear feedback shift registers to generate said sequences, using a first set of linear feedback shift registers to generate a sequence corresponding to a rising edge, and using a second set of linear feedback shift registers to generate a sequence corresponding to a falling edge.

50. A method as recited in claim 49, further comprising using a plurality of comparators to compare the signatures to expected vector values and generate at least one signal based on the result of the comparison.

51. A method as recited in claim 49, further comprising providing a stop signal to the interface to interrupt the test.

52. A method as recited in claim 48, further comprising generating signatures in response to said sequences.

53. A method as recited in claim 52, further comprising using a calibration circuit to determine an actual delay associated with programmable delay cells in the interface which are used to set said propagation delays.

54. A method as recited in claim 46, further comprising setting propagation delays of clock and data signals to perform timing margin tests.

55. A method as recited in claim 46, further comprising running the test, stopping the test, determining whether there was a failure during the test, and if there was a failure during the test, re-starting the test and stopping the test at an earlier point in time, thereby conducting a debugging operation.

56. A method as recited in claim 46, further comprising running the test until said built-in self test logic receives a stop signal, comparing sequences generated in the interface to expected vector values and generating a pass/fail output signal, if said pass/fail output signal indicates that there was a failure during the test, re-starting the test and stopping the test at an earlier point in time in an attempt to determine when the error occurs.

* * * * *